(12) United States Patent
Khlat

(10) Patent No.: US 8,320,850 B1
(45) Date of Patent: Nov. 27, 2012

(54) POWER CONTROL LOOP USING A TUNABLE ANTENNA MATCHING CIRCUIT

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 316 days.

(21) Appl. No.: 12/726,817

(22) Filed: Mar. 18, 2010

Related U.S. Application Data

(60) Provisional application No. 61/161,333, filed on Mar. 18, 2009.

(51) Int. Cl.
- *H03C 1/52* (2006.01)
- *H01Q 11/12* (2006.01)
- *H04B 1/04* (2006.01)

(52) U.S. Cl. ......................... 455/107; 455/123

(58) Field of Classification Search .............. 455/522, 455/77, 107, 120, 121, 123, 125, 127.1, 127.2
See application file for complete search history.

(56) References Cited

U.S. PATENT DOCUMENTS

| | | | | |
|---|---|---|---|---|
| 6,725,021 | B1 * | 4/2004 | Anderson et al. | 455/115.1 |
| 7,359,681 | B2 * | 4/2008 | Cho | 455/107 |
| 7,379,714 | B2 * | 5/2008 | Haque et al. | 455/107 |
| 8,000,737 | B2 * | 8/2011 | Caimi et al. | 455/550.1 |
| 2002/0142790 | A1 * | 10/2002 | Samelis et al. | 455/522 |
| 2003/0153345 | A1 * | 8/2003 | Cramer, III | 455/522 |

OTHER PUBLICATIONS

Litwinczuk, N., "Computer-aided design of automatic antenna matching devices," IEEE 6th International Symposium on Electromagnetic Compatibility and Electromagnetic Ecology, 2005, pp. 166-170, IEEE.

Meng, Fanfan, et al., "A Mismatch Detector for Adaptive Antenna Impedance Matching," 36th European Microwave Conference, 2006, pp. 1457-1460, Sep. 10-15, 2006, IEEE.

Mileusnic, Mladen, et al., "Design and implementation of fast antenna tuners for HF radio systems," Proceedings of 1997 International Conference on Information, Communications and Signal Processing, 1997, pp. 1722-1726, vol. 3, IEEE.

Moritz, J.R., et al., "Frequency agile antenna tuning and matching," Eighth International Conference on HF Radio Systems and Techniques, IEE Conf. Publ. No. 474, 2000, pp. 169-174, IEEE.

Sjoblom, Peter, et al., "An Adaptive Impedance Tuning CMOS Circuit for ISM 2.4-GHz Band," IEEE Transactions on Circuits and Systems I: Regular Papers, Jun. 2005, pp. 1115-1124, vol. 52, No. 6, IEEE.

Song, H. et al., "Automatic Antenna Tuning Unit for Software-Defined and Cognitive Radio," 2007 IEEE Antennas and Propagation Society International Symposium, Jun. 9-15, 2007, pp. 85-88, IEEE.

* cited by examiner

*Primary Examiner* — Nguyen Vo
(74) *Attorney, Agent, or Firm* — Withrow & Terranova, P.L.L.C.

(57) ABSTRACT

The present disclosure relates to combining tunable antenna matching circuit adjustments and RF power amplifier output power adjustments of a first RF terminal in response to output power adjustment commands received from a second RF terminal. The output power adjustment commands may be part of an output power control loop between the first RF terminal and the second RF terminal to control the output power from the first RF terminal. The first RF terminal may include an RF receiver, an RF power amplifier, and a tunable antenna matching circuit coupled between an output of the RF power amplifier and an antenna. The tunable antenna matching circuit adjustments may be impedance adjustments of the tunable antenna matching circuit and the RF power amplifier output power adjustments may result from adjustments to one or more input signals to the RF power amplifier.

22 Claims, 11 Drawing Sheets

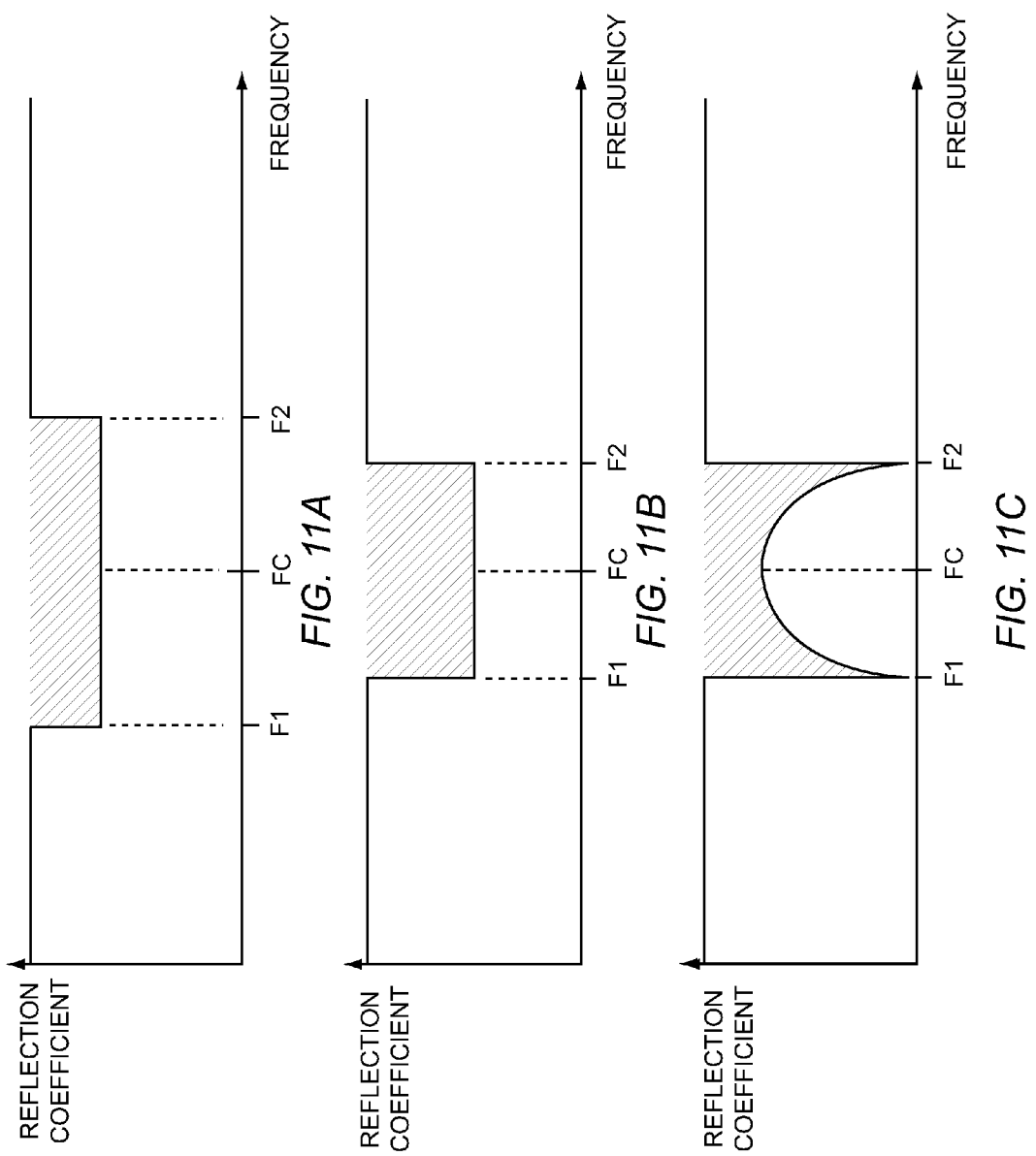

POWER CONTROL LOOP USING A TUNABLE ANTENNA MATCHING CIRCUIT

This application claims the benefit of provisional patent application Ser. No. 61/161,333, filed Mar. 18, 2009 the disclosure of which is hereby incorporated herein by reference in its entirety.

FIELD OF THE DISCLOSURE

Embodiments of the present disclosure relate to tunable antenna matching circuits and radio frequency (RF) transceivers that may be used in RF communications systems.

BACKGROUND OF THE DISCLOSURE

In an RF communications system, an RF power amplifier feeds an RF output signal to an antenna for transmission. The delivered power to the antenna may be affected by an impedance match between the RF power amplifier and the antenna. Impedance mismatches may cause reflections of the RF output signal, thereby reducing the delivered power to the antenna. There are several possible causes of impedance mismatch. In a multi-mode or multi-band RF system, the antenna may need to be coupled to multiple RF power amplifiers, to multiple RF receivers, or the like. As a result, providing a matched impedance to the antenna under all operating conditions may be problematic.

Notably, the input impedance to the antenna may change due to localized antenna conditions. For example, in a portable RF terminal, such as a cell phone, anything in proximity to the antenna may change the antenna's input impedance. Holding a cell phone next to a user's body or laying the cell phone on a table may change the input impedance, thereby causing impedance mismatches. Experimental data has shown that normal body movements can cause significant antenna input impedance changes in time frames on the order of one millisecond. One technique for correcting impedance mismatches is to use a tunable antenna matching circuit between the RF power amplifier and the antenna to provide an impedance match. Power detection circuitry may be coupled in the signal path between the RF power amplifier and the antenna to determine forward power from the RF power amplifier and reflected power back to the RF power amplifier to assess the impedance mismatch. Then, the tunable antenna matching circuit may be adjusted to improve the impedance match, thereby decreasing the reflected power and increasing the delivered power to the antenna.

During RF communications, a first RF terminal may be communicating with a second RF terminal. The second RF terminal may send ongoing commands to the first RF terminal instructing the first RF terminal to adjust its output power based on signal strengths of the signals received by the second RF terminal from the first RF terminal. Such ongoing commands may be part of an output power control loop between the first RF terminal and the second RF terminal. By continually adjusting the output power from the first RF terminal, the signal strengths are large enough to provide reliable communications, while reducing interference caused by the signals transmitted from the first RF terminal that reach other RF communications devices.

The signal strengths of the signals transmitted from the first RF terminal are directly related to the delivered power from an RF power amplifier to an antenna in the first RF terminal. As such, adjustments made to the tunable antenna matching circuit may influence or cause errors to the output power adjustments of the first RF terminal in response to commands from the second RF terminal. Thus, there is a need to reduce or compensate the influence that tunable antenna matching circuit adjustments have on the output power adjustments of the first RF terminal in response to commands from the second RF terminal.

SUMMARY OF THE EMBODIMENTS

The present disclosure relates to combining tunable antenna matching circuit adjustments and RF power amplifier output power adjustments of a first RF terminal in response to output power adjustment commands received from a second RF terminal. The output power adjustment commands may be part of an output power control loop between the first RF terminal and the second RF terminal to control the output power from the first RF terminal. The first RF terminal may include an RF receiver, an RF power amplifier, and a tunable antenna matching circuit coupled between an output of the RF power amplifier and an antenna. The output power adjustment commands are received by the RF receiver and the tunable antenna matching circuit adjustments may be impedance adjustments of the tunable antenna matching circuit. The RF power amplifier output power adjustments may result from adjustments to one or more input signals to the RF power amplifier.

For example, the RF power amplifier output power adjustments may result from adjustments to an RF input signal to the RF power amplifier, from adjustments to an envelope power supply signal to the RF power amplifier, from adjustments to one or more bias signals to the RF power amplifier, from enabling or disabling one or more segments in the RF power amplifier, or any combination thereof.

Prior art systems may use two separate control loops. A first control loop may be used for tunable antenna matching circuit adjustments and a second control loop may be used for RF power amplifier output power adjustments of a first RF terminal in response to output power adjustment commands received from a second RF terminal. However, interactions between the two separate control loops may cause instabilities. In one embodiment of the present disclosure, by bringing the tunable antenna matching circuit adjustments into the second control loop, such interactions and instabilities may be avoided.

In certain third generation (3G) and fourth generation (4G) communications protocols, full duplex operation is used. In full duplex operation, transmissions may be continuous. Therefore, in one embodiment of the present disclosure, the tunable antenna matching circuit adjustments and the RF power amplifier output power adjustments may be made at slot boundaries of an RF output signal to provide stability and avoid disruption of the RF output signal.

In one embodiment of the present disclosure, the RF output signal includes amplitude modulation (AM). To maintain spectral purity requirements and to meet error vector magnitude (EVM) requirements mandated by certain RF communications protocols, the tunable antenna matching circuit adjustments may be made during low amplitude portions of amplitude modulated RF output signals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
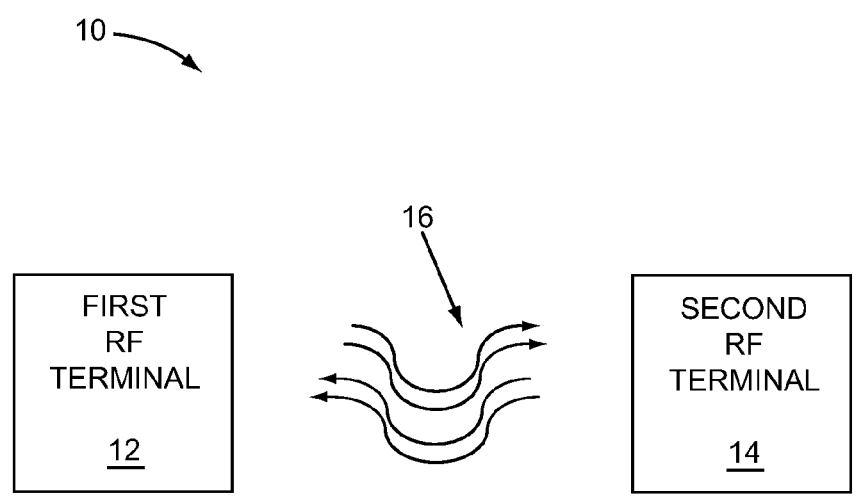
FIG. 1 shows an RF communications system according to one embodiment of the RF communications system.

FIGS. 11A, 11B, and 11C are impedance responses of impedance matching networks that illustrated theoretical limitations on the impedance matching networks.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to combining tunable antenna matching circuit adjustments and RF power amplifier output power adjustments of a first RF terminal in response to output power adjustment commands received from a second RF terminal. The output power adjustment commands may be part of an output power control loop between the first RF terminal and the second RF terminal to control the output power from the first RF terminal. The first RF terminal may include an RF receiver, an RF power amplifier, and a tunable antenna matching circuit coupled between an output of the RF power amplifier and an antenna. The output power adjustment commands are received by the RF receiver and the tunable antenna matching circuit adjustments may be impedance adjustments of the tunable antenna matching circuit. The RF power amplifier output power adjustments may result from adjustments to one or more input signals to the RF power amplifier.

For example, the RF power amplifier output power adjustments may result from adjustments to an RF input signal to the RF power amplifier, from adjustments to an envelope power supply signal to the RF power amplifier, from adjustments to one or more bias signals to the RF power amplifier, from enabling or disabling one or more segments in the RF power amplifier, or any combination thereof.

Prior art systems may use two separate control loops. A first control loop may be used for tunable antenna matching circuit adjustments and a second control loop may be used for RF power amplifier output power adjustments of a first RF terminal in response to output power adjustment commands received from a second RF terminal. However, interactions between the two separate control loops may cause instabilities. In one embodiment of the present disclosure, by bringing the tunable antenna matching circuit adjustments into the second control loop, such interactions and instabilities may be avoided.

In certain third generation (3G) and fourth generation (4G) communications protocols, full duplex operation is used. In full duplex operation, transmissions may be continuous. Therefore, in one embodiment of the present disclosure, the tunable antenna matching circuit adjustments and the RF power amplifier output power adjustments may be made at slot boundaries of an RF output signal to provide stability and avoid disruption of the RF output signal.

In one embodiment of the present disclosure, the RF output signal includes amplitude modulation (AM). To maintain spectral purity requirements and to meet error vector magnitude (EVM) requirements mandated by certain RF communications protocols, the tunable antenna matching circuit adjustments may be made during low amplitude portions of amplitude modulated RF output signals.

FIG. 1 shows an RF communications system 10 according to one embodiment of the RF communications system 10. The RF communications system 10 includes a first RF terminal 12 and a second RF terminal 14. The first RF terminal 12 may be communicating with the second RF terminal 14 using RF signals 16, which may be transmitted to the first RF terminal 12 from the second RF terminal 14 and to the second RF terminal 14 from the first RF terminal 12. The second RF terminal 14 may send ongoing commands to the first RF terminal 12 instructing the first RF terminal 12 to adjust an output power from the first RF terminal 12. The ongoing commands may be based on signal strengths of the RF signals 16 received by the second RF terminal 14 from the first RF terminal 12. As such, the ongoing commands may be part of an output power control loop between the first RF terminal 12 and the second RF terminal 14. The ongoing commands may include a first command, which is followed by a second command, which is followed by a third command, and so on. In an alternate embodiment of the RF communications system 10, the second RF terminal 14 sends a single command to the first RF terminal 12 instructing the first RF terminal 12 to adjust the output power from the first RF terminal 12. In an exemplary embodiment of the RF communications system 10, the second RF terminal 14 is a base station, such as on a cell phone tower, and the first RF terminal 12 is a mobile terminal, such as a cell phone.

Figure 2:
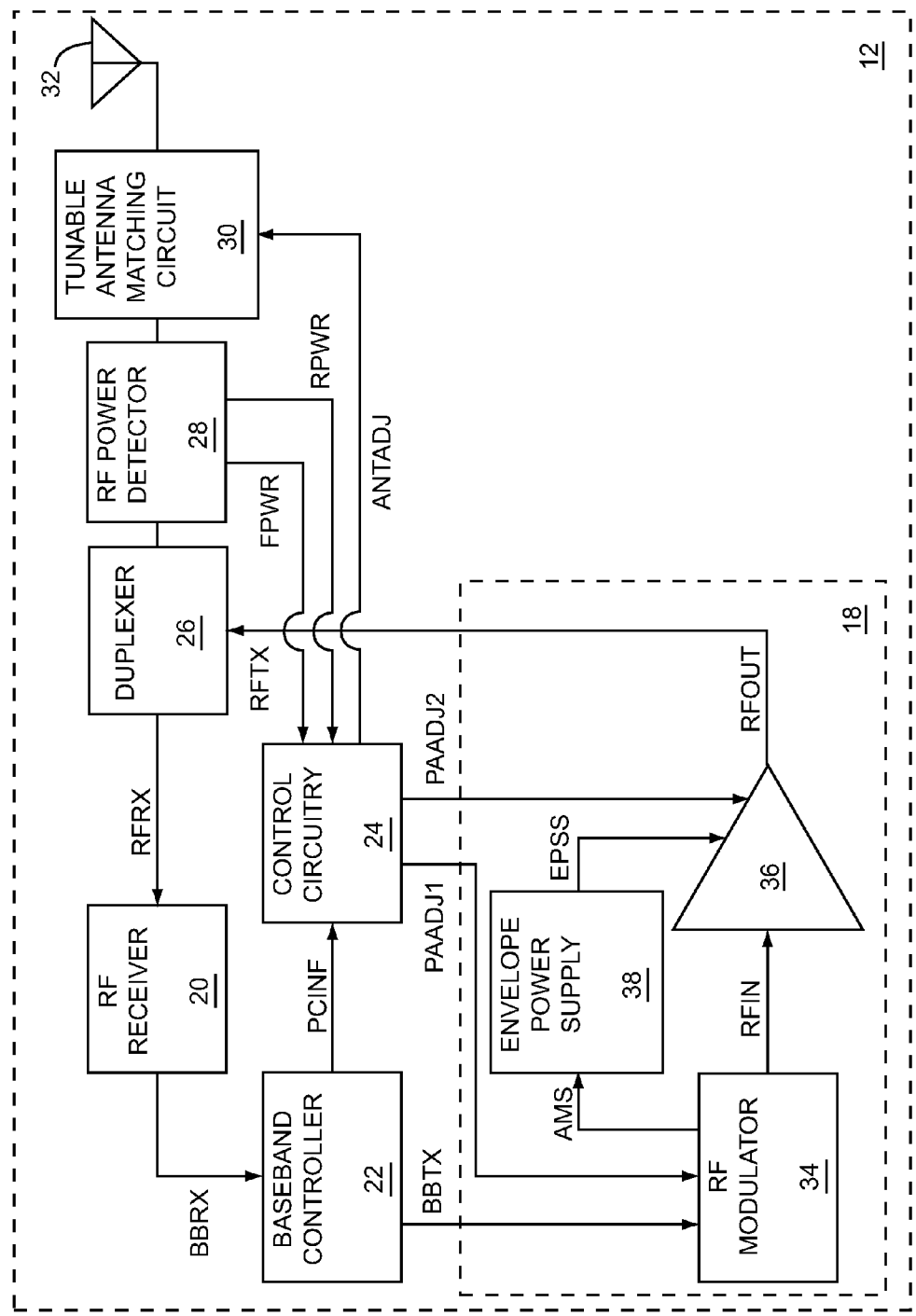
FIG. 2 shows details of a first RF terminal illustrated in FIG. 1 according to one embodiment of the first RF terminal.

FIG. 2 shows details of the first RF terminal 12 illustrated in FIG. 1 according to one embodiment of the first RF terminal 12. The first RF terminal 12 includes an RF transmitter 18, an RF receiver 20, a baseband controller 22, control circuitry 24, a duplexer 26, an RF power detector 28, a tunable antenna matching circuit 30, and an antenna 32. The RF transmitter 18 includes an RF modulator 34, an RF power amplifier 36, and an envelope power supply 38. The RF power detector 28 and the tunable antenna matching circuit 30 are coupled in series between the duplexer 26 and the antenna 32. The tunable antenna matching circuit 30 may be used to provide a least an approximate impedance match to the antenna 32 at one or more desired operating frequency. The RF power detector 28 may be used to detect forward power being sent to the antenna 32 through the tunable antenna matching circuit 30 and to detect reflected power from the antenna 32 through the tunable antenna matching circuit 30.

The duplexer 26 may provide an RF receive signal RFRX to the RF receiver 20 based on an RF signal received by the antenna 32. Further, the duplexer 26 may receive an RF transmit signal RFTX from the RF transmitter 18 to provide an RF signal for transmission to the RF power detector 28. The duplexer 26 may be used in a full duplex system in which RF signals are received and transmitted simultaneously by the first RF terminal 12. Full duplex systems may be associated with 3G and 4G communications protocols. As such, a carrier frequency of the RF receive signal RFRX may be separated from a carrier frequency of the RF transmit signal RFTX by a duplex frequency, and the duplexer 26 may provide isolation between the RF receive signal RFRX and the RF transmit signal RFTX. The tunable antenna matching circuit 30 may be used to provide at least an approximate impedance match to the antenna 32 at the carrier frequency of the RF receive signal RFRX and at the carrier frequency of the RF transmit signal RFTX.

In multi-band RF systems, the first RF terminal 12 may transmit and receive RF signals in different RF frequency bands. As such, the carrier frequencies of the RF transmit and receive signals RFTX, RFRX may change significantly. As a result, the tunable antenna matching circuit 30 may typically be adjusted to provide at least an approximate impedance match to the antenna 32 at the carrier frequency of the RF receive signal RFRX and at the carrier frequency of the RF transmit signal RFTX.

The RF receiver 20 may downconvert the RF receive signal RFRX to provide a baseband receive signal BBRX to the baseband controller 22. Conversely, the baseband controller 22 may provide a baseband transmit signal BBTX to the RF transmitter 18, which may RF modulate the baseband transmit signal BBTX to provide an RF transmit signal RFTX to the duplexer 26. Specifically, the RF modulator 34 may receive the baseband transmit signal BBTX and may provide an RF input signal RFIN to the RF power amplifier 36 and may provide an AM signal AMS to the envelope power supply 38 based on the baseband transmit signal BBTX. The envelope power supply 38 may provide an envelope power supply signal EPSS to the RF power amplifier 36 based on the AM signal AMS. In one embodiment of the RF modulator 34, the AM signal AMS is set to a fixed value, which may be adjusted, depending on an output power level from the RF power amplifier 36. In an alternate embodiment of the RF modulator 34, the AM signal AMS is based on desired AM of the RF output signal RFOUT. The RF power amplifier 36 may amplify the RF input signal RFIN to provide an RF output signal RFOUT from an output of the RF power amplifier 36. The RF power amplifier 36 may extract power from the envelope power supply signal EPSS to provide the RF output signal RFOUT. The RF power amplifier 36 may operate in either a saturated mode or a non-saturated mode. In the non-saturated mode, an amplitude of the RF output signal RFOUT is based on an amplitude of the RF input signal RFIN. However, in the saturated mode, the amplitude of the RF output signal RFOUT is based on an amplitude of the envelope power supply signal EPSS. The RF output signal RFOUT may provide the RF transmit signal RFTX to the duplexer 26.

The baseband controller 22 may provide power control information PCINF to the control circuitry 24 based on at least a first power control command received from the second RF terminal 14. In one embodiment of the present disclosure, the at least the first power control command is a transmit power control (TPC) command. The RF power detector 28 may provide a forward power signal FPWR to the control circuitry 24 based on the detected forward power being sent to the antenna 32 and may provide a reverse power signal RPWR to the control circuitry 24 based on the detected reflected power from the antenna 32. The control circuitry 24 may provide a first power amplifier adjustment signal PAADJ1 to the RF modulator 34, a second power amplifier adjustment signal PAADJ2 to the RF power amplifier 36, and an antenna matching adjustment signal ANTADJ to the tunable antenna matching circuit 30.

The RF modulator 34 may adjust an amplitude of the RF input signal RFIN, may adjust an amplitude or a magnitude of the AM signal AMS, or both based on the first power amplifier adjustment signal PAADJ1 to adjust the output power from the RF power amplifier 36. The RF power amplifier 36 may change biasing of one or more amplifier stages, may enable or disable amplifier segments, or any combination thereof based on the second power amplifier adjustment signal PAADJ2 to adjust the output power from the RF power amplifier 36. The tunable antenna matching circuit 30 may adjust an impedance of the tunable antenna matching circuit 30 based on the antenna matching adjustment signal ANTADJ.

The control circuitry 24 may evaluate an impedance match being provided by the tunable antenna matching circuit 30 and then make adjustments based on an accuracy of the impedance match. The evaluation of the impedance match may be based on a difference between the forward power and the reflected power as provided by the forward power signal FPWR and the reverse power signal RPWR. If reflected power is minimal compared with the forward power, the control circuitry 24 may not make adjustments to the tunable antenna matching circuit 30. However, since adjustments to the tunable antenna matching circuit 30 may change the output power from the first RF terminal 12, adjustments to the tunable antenna matching circuit 30 may need to be factored into any output power adjustments from the first RF terminal 12 made by the control circuitry 24.

The power control information PCINF may direct the control circuitry 24 to increase the output power from the first RF terminal 12, to decrease the output power from the first RF terminal 12, or to not change the output power from the first RF terminal 12. As such, the control circuitry 24 may or may not make adjustments to the tunable antenna matching circuit 30 and may or may not make adjustments to the output power from the RF power amplifier 36. The control circuitry 24 may determine delivered power to the antenna 32 based on the difference between the forward power and the reflected power as provided by the forward power signal FPWR and the reverse power signal RPWR.

In a first exemplary embodiment of the first RF terminal 12, the baseband controller 22 receives a first command from the second RF terminal 14 instructing the first RF terminal 12 to adjust its output power. Next, the control circuitry 24 determines a magnitude and direction of a desired power adjustment based on the first command. Either before or after receiving the first command, the control circuitry 24 determines the delivered power to the tunable antenna matching circuit 30 using the forward power signal FPWR and the reverse power signal RPWR; the control circuitry 24 makes an adjustment to the tunable antenna matching circuit 30 based on the first command using the antenna matching adjustment signal ANTADJ. After the adjustment to the antenna matching adjustment signal ANTADJ, the control circuitry 24 determines the delivered power to the tunable antenna matching circuit 30 using the forward power signal FPWR and the reverse power signal RPWR. The control circuitry 24 the determines a change in delivered power as a result of the making the adjustment to the tunable antenna matching circuit 30 by taking a difference between the delivered power to the tunable antenna matching circuit 30 before the adjustment and the delivered power to the tunable antenna matching circuit 30 after the adjustment. The control circuitry 24 then modifies the desired power adjustment based on the change in delivered power. The control circuitry 24 finally makes an adjustment to the output power from the RF power amplifier 36 based on the modified desired power adjustment using the first power amplifier adjustment signal PAADJ1, the second power amplifier adjustment signal PAADJ2, or both.

In an example of the first exemplary embodiment, the control circuitry 24 determines that the delivered power to the tunable antenna matching circuit 30 is 24.0 decibel milliwatts (dBm). Next, the baseband controller 22 receives the first command instructing the first RF terminal 12 to increase its power by one dBm. The control circuitry 24 then makes an adjustment to the tunable antenna matching circuit 30. After the adjustment, the control circuitry 24 determines that the delivered power to the tunable antenna matching circuit 30 is 24.25 dBm, therefore, the adjustment to the tunable antenna matching circuit 30 increased the output power from the first RF terminal 12 by about 0.25 dBm. The control circuitry 24 subtracts the 0.25 dBm from the one dBm desired output power adjustment specified in the first command; and the control circuitry 24 increases the output power from the RF power amplifier 36 by about 0.75 dBm. If the first RF terminal 12 receives ongoing commands from the second RF terminal 12 as part of an output power control loop, even if the power adjustments aren't perfect, any adjustment errors will eventually be corrected by future power adjustment commands.

In general, the control circuitry 24 adjusts the impedance of the tunable antenna matching circuit 30 in response to the first command; the control circuitry 24 detects a change in the output power from the first RF terminal 12 resulting from the adjustment of the impedance of the tunable antenna matching circuit 30; the control circuitry 24 determines modified power adjustment information based on modifying power adjustment information specified in the first command using the detected change in the output power; and the control circuitry 24 adjusts the output power from the RF power amplifier 36 based on the modified power adjustment information.

In a second exemplary embodiment of the first RF terminal 12, the baseband controller 22 receives the first command from the second RF terminal 14. Next, the control circuitry 24 makes an adjustment to the tunable antenna matching circuit 30 based on the first command using the antenna matching adjustment signal ANTADJ. The baseband controller 22 then receives a second command from the second RF terminal 14. Finally, the control circuitry 24 makes an adjustment to the output power from the RF power amplifier 36 based on the second command using the first power amplifier adjustment signal PAADJ1, the second power amplifier adjustment signal PAADJ2, or both.

Alternate embodiments of the first RF terminal 12 may any combination of information provided by the power control information PCINF, the forward power signal FPWR, and the reverse power signal RPWR using any number of output power adjustment commands to make antenna matching adjustments using the antenna matching adjustment signal ANTADJ and to make RF power amplifier 36 output power adjustments using the first power amplifier adjustment signal PAADJ1, the second power amplifier adjustment signal PAADJ2, or both.

In an alternate embodiment of the control circuitry 24, either the first power amplifier adjustment signal PAADJ1 or the second power amplifier adjustment signal PAADJ2 is omitted.

Figure 3:
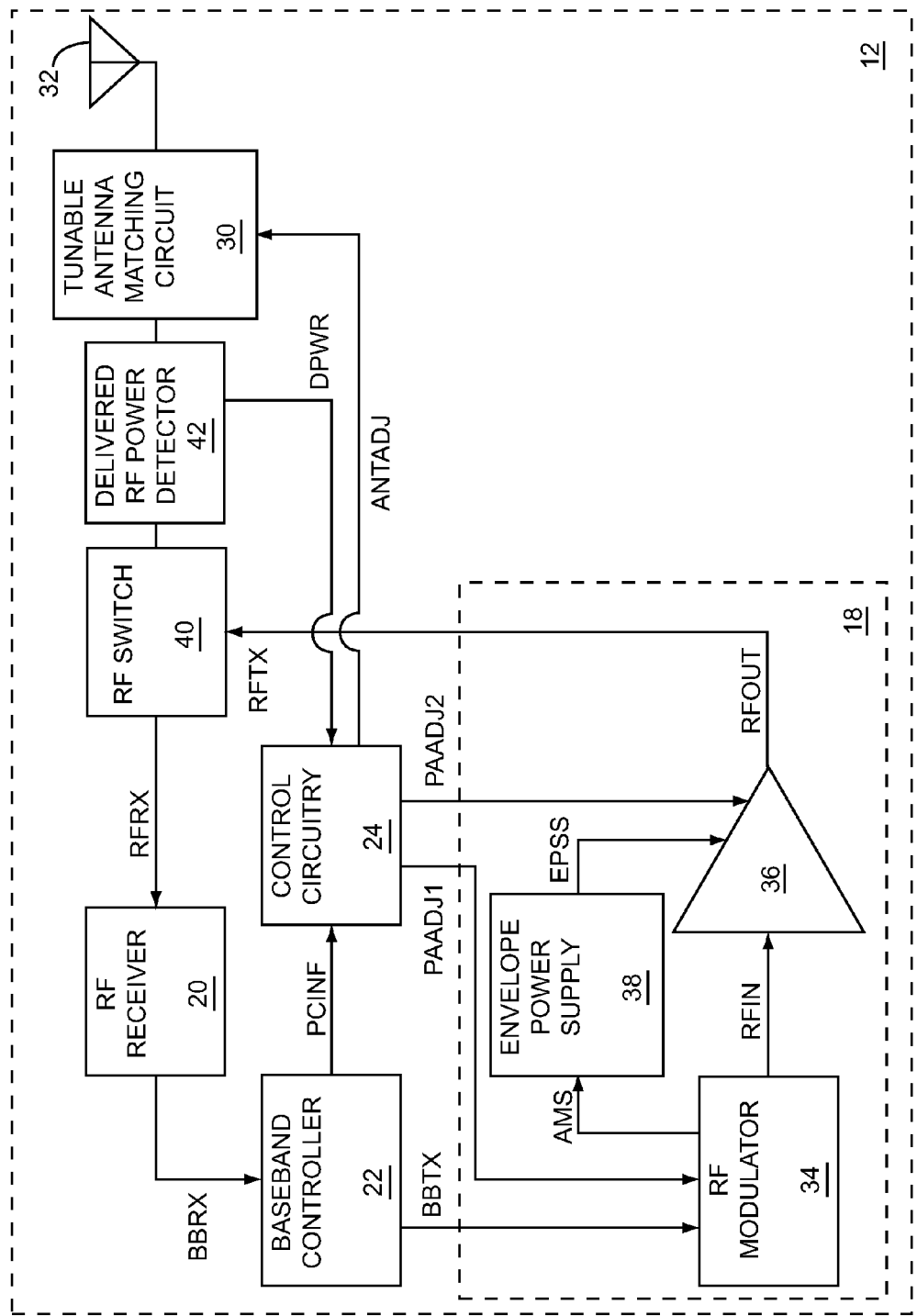
FIG. 3 shows details of the first RF terminal illustrated in FIG. 1 according to an alternate embodiment of the first RF terminal.

FIG. 3 shows details of the first RF terminal 12 illustrated in FIG. 1 according to an alternate embodiment of the first RF terminal 12. The first RF terminal 12 illustrated in FIG. 3 is similar to the first RF terminal 12 illustrated in FIG. 2, except in the first RF terminal 12 illustrated in FIG. 3, the duplexer 26 is replaced with an RF switch 40 and the RF power detector 28 is replaced with a delivered RF power detector 42. The duplexer 26 may be used with full duplex or half duplex communications protocols. However, the RF switch 40 is suitable for use with half duplex protocols. During half duplex operation, the first RF terminal 12 is either transmitting RF signals 16 or receiving RF signals 16, but not both simultaneously. As such, the RF switch 40 is selected to either couple the RF receiver 20 to the antenna 32 or couple the output of the RF power amplifier 36 to the antenna 32, but not both simultaneously.

The RF power detector 28 illustrated in FIG. 2 provided the forward power signal FPWR and the reverse power signal RPWR to the control circuitry 24, which used both the forward power signal FPWR and the reverse power signal RPWR to determine delivered power to the tunable antenna matching circuit 30. However, the delivered RF power detector 42 detects delivered power to the tunable antenna matching circuit 30 and provides a delivered power signal DPWR to the control circuitry 24 based on the delivered power. As such, the forward power signal FPWR and the reverse power signal RPWR are eliminated. Alternate embodiments of the delivered RF power detector 42 may provide the forward power signal FPWR, the reverse power signal RPWR, or both in addition to the delivered power signal DPWR.

Figure 4:
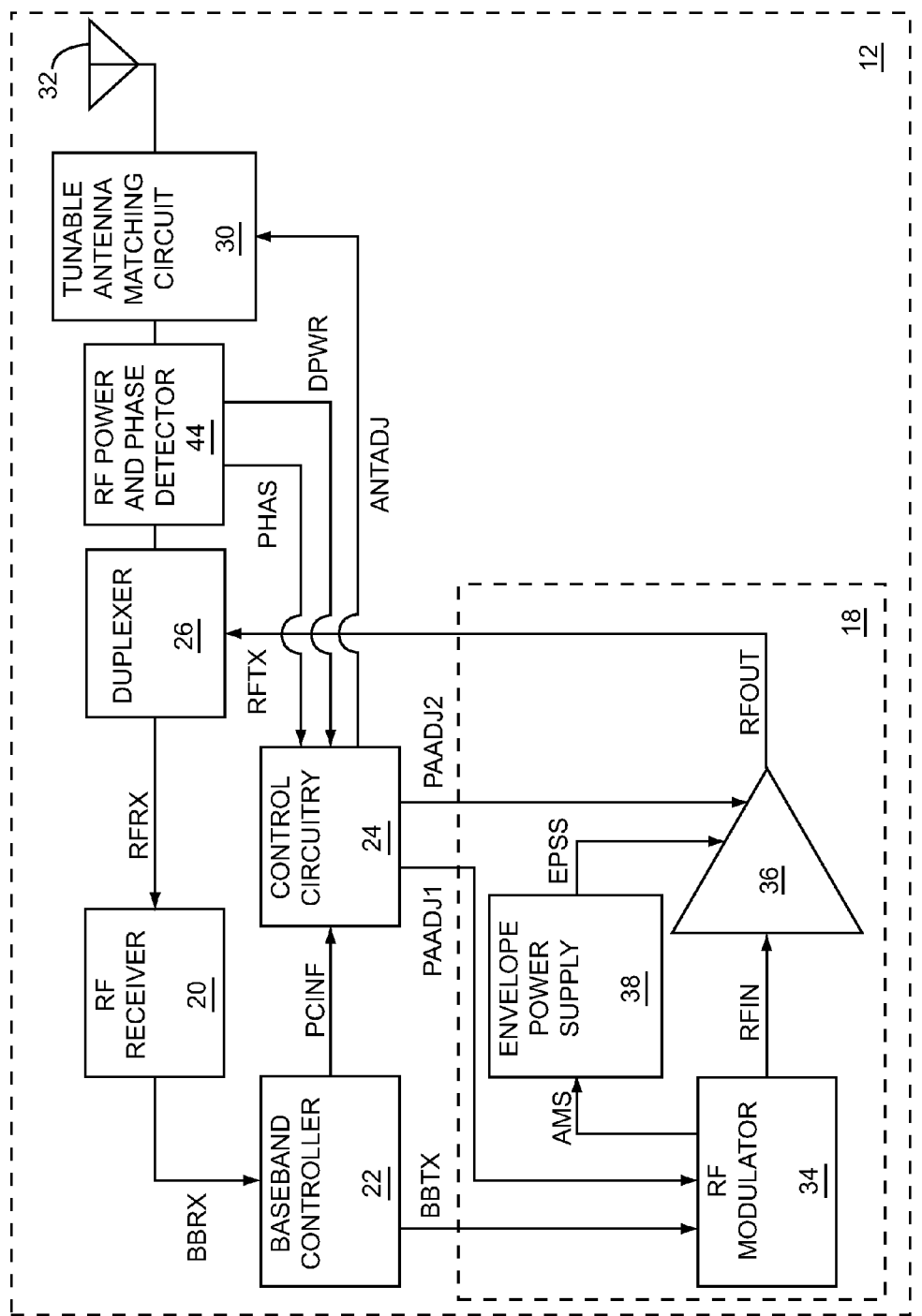
FIG. 4 shows details of the first RF terminal illustrated in FIG. 1 according to an additional embodiment of the first RF terminal.

FIG. 4 shows details of the first RF terminal 12 illustrated in FIG. 1 according to an additional embodiment of the first RF terminal 12. The first RF terminal 12 illustrated in FIG. 4 is similar to the first RF terminal 12 illustrated in FIG. 2, except in the first RF terminal 12 illustrated in FIG. 4, the RF power detector 28 is replaced with an RF power and phase detector 44. The RF power detector 28 illustrated in FIG. 2 provided the forward power signal FPWR and the reverse power signal RPWR to the control circuitry 24, which used both the forward power signal FPWR and the reverse power signal RPWR to determine delivered power to the tunable antenna matching circuit 30. However, the RF power and phase detector 44 illustrated in FIG. 4 detects delivered power to the tunable antenna matching circuit 30 and provides a delivered power signal DPWR to the control circuitry 24 based on the delivered power. As such, the forward power signal FPWR and the reverse power signal RPWR are eliminated. Alternate embodiments of the delivered RF power detector 42 may provide the forward power signal FPWR, the reverse power signal RPWR, or both in addition to the delivered power signal DPWR.

Additionally, the RF power and phase detector 44 detects a phase of the RF transmit signal RFTX and provides a phase signal PHAS to the control circuitry 24 based on the detected phase of the RF transmit signal RFTX. An RF communications protocol may have phase shift or phase jump restrictions. Therefore, when the control circuitry 24 adjusts the tunable antenna matching circuit 30, an unacceptable phase shift or phase jump may occur. As a result, the control circuitry 24 may detect a phase shift of the RF transmit signal RFTX resulting from adjusting an impedance of the tunable antenna matching circuit 30 and then apply a compensating phase shift of the RF input signal RFIN. By applying the compensating phase shift, the phase of the RF transmit signal RFTX may be at least approximately shifted back to its original value. The control circuitry 24 may apply the compensating phase shift by sending phase shift adjustment information to the RF modulator 34 using the first power amplifier adjustment signal PAADJ1. The RF modulator 34 phase shifts the RF input signal RFIN based on the phase shift adjustment information. The phase shift of the RF input signal RFIN is carried though to the RF transmit signal RFTX.

By detecting the phase shift of the RF transmit signal RFTX resulting from adjusting the impedance of the tunable antenna matching circuit 30, the control circuitry 24 may limit the size of each adjustment of the tunable antenna matching circuit 30 to stay within phase shift or phase jump limits imposed by the communications protocol. As a result, the control circuitry 24 may iterate the number of adjustments to the tunable antenna matching circuit 30 and phase shift compensations to achieve a final desired adjustment to the tunable antenna matching circuit 30, while staying within communications protocol limits.

Figure 5:
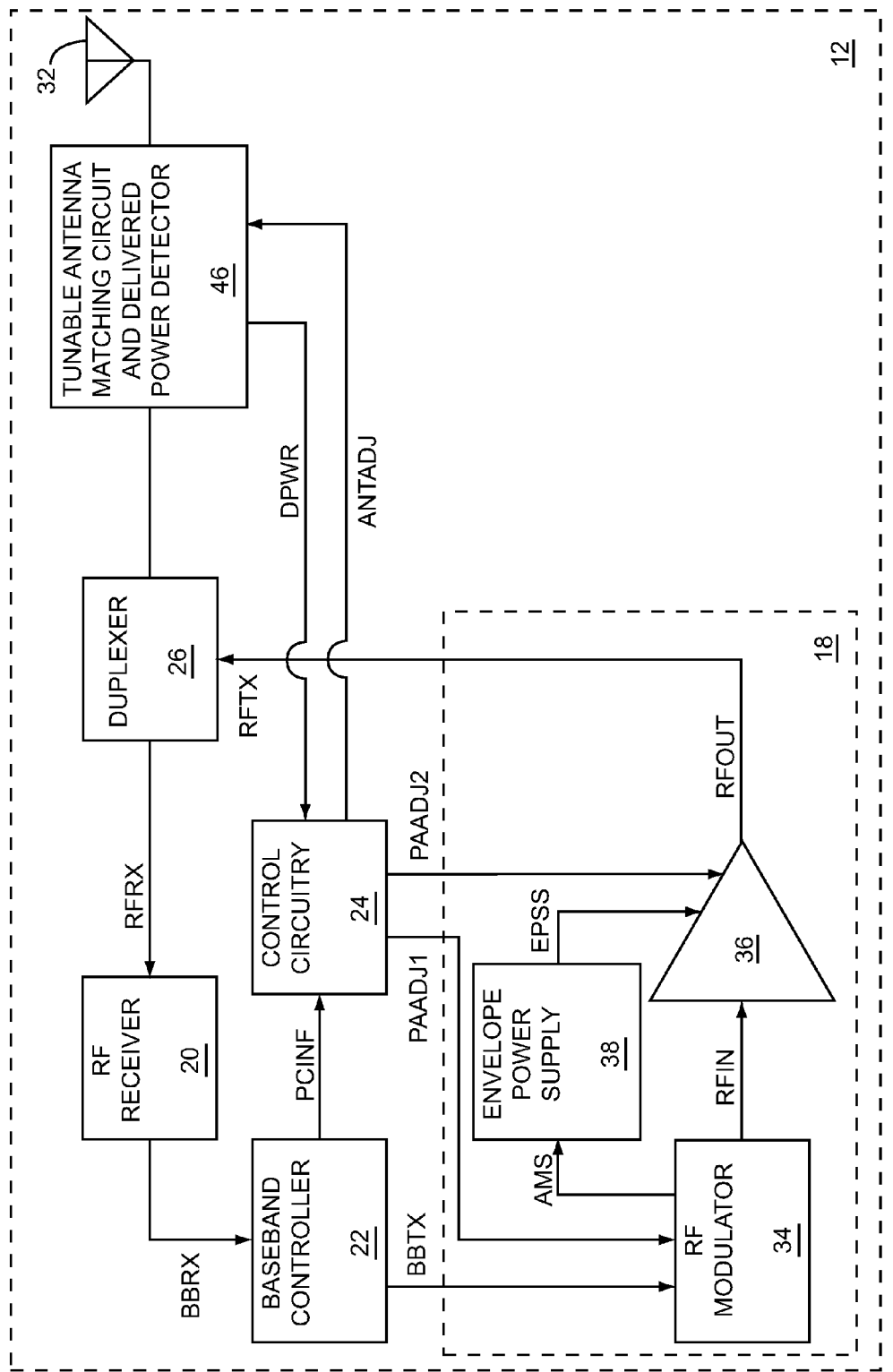
FIG. 5 shows details of the first RF terminal illustrated in FIG. 1 according to another embodiment of the first RF terminal.

FIG. 5 shows details of the first RF terminal 12 illustrated in FIG. 1 according to another embodiment of the first RF terminal 12. FIG. 5 shows details of the first RF terminal 12 illustrated in FIG. 1 according to an additional embodiment of the first RF terminal 12. The first RF terminal 12 illustrated in FIG. 5 is similar to the first RF terminal 12 illustrated in FIG. 2, except in the first RF terminal 12 illustrated in FIG. 5, the RF power detector 28 and the tunable antenna matching circuit 30 are replaced with a tunable antenna matching circuit and delivered power detector 46. The RF power detector 28 illustrated in FIG. 2 provided the forward power signal FPWR and the reverse power signal RPWR to the control circuitry 24, which used both the forward power signal FPWR and the reverse power signal RPWR to determine delivered power to the tunable antenna matching circuit 30.

However, the tunable antenna matching circuit and delivered power detector 46 illustrated in FIG. 5 detects delivered power to the antenna 32 and provides a delivered power signal DPWR to the control circuitry 24 based on the delivered power. As such, the forward power signal FPWR and the reverse power signal RPWR are eliminated. Alternate embodiments of the tunable antenna matching circuit and delivered power detector 46 may provide the forward power signal FPWR, the reverse power signal RPWR, or both in addition to the delivered power signal DPWR. The tunable antenna matching circuit and delivered power detector 46 receives the antenna matching adjustment signal ANTADJ and may provide tunable antenna matching functionality similar to the tunable antenna matching circuit 30. As such, in broad terms, the tunable antenna matching circuit and delivered power detector 46 is a tunable antenna matching circuit and is also a delivered power detector.

Figure 6:
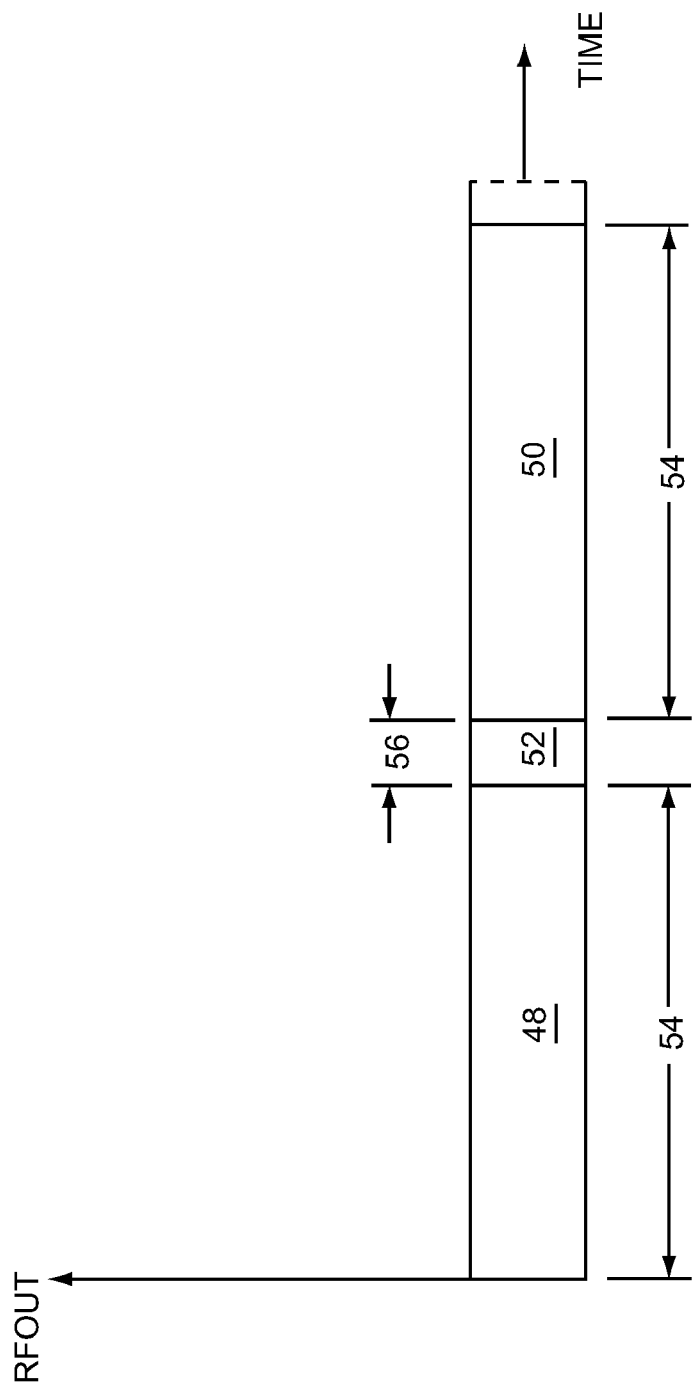
FIG. 6 shows details of an RF output signal illustrated in FIG. 2 according to one embodiment of the first RF terminal.

FIG. 6 shows details of the RF output signal RFOUT illustrated in FIG. 2 according to one embodiment of the first RF terminal 12. In a full duplex operating mode, the first RF terminal 12 may provide continuous transmission of RF signals 16. Such a mode may be used with 3G or 4G communications protocols and may continuously transmit information using multiple communications slots, which are separated by slot boundaries in time. For example, information is transmitted using a first slot 48 followed by information transmitted using a second slot 50. The first slot 48 and the second slot 50 may be separated in time by a slot boundary 52. Typically, a slot boundary 52 follows the second slot 50 and multiple slots follow. The first and second slots 48, 50 may have a slot duration 54 and the slot boundary 52 may have a slot boundary duration 56. In some communications protocols, modifications may be made to transmitted RF signals during the slot boundary 52 without violating the communications protocol. Therefore, adjustments to the impedance of the tunable antenna matching circuit 30, to the impedance of the tunable antenna matching circuit and delivered power detector 46, to the output power of the RF power amplifier 36, or any combination thereof may be made during the slot boundary 52.

In one embodiment of the first RF terminal 12, adjustments to the impedance of the tunable antenna matching circuit 30 or to the impedance of the tunable antenna matching circuit and delivered power detector 46 and to the output power of the RF power amplifier 36 are made during each slot boundary. In a first exemplary embodiment of the first RF terminal 12, the first RF terminal 12 is transmitting 3G RF signals 16, such that the slot duration 54 is about 667 microseconds and the slot boundary duration 56 is about 25 microseconds. In a second exemplary embodiment of the first RF terminal 12, the first RF terminal 12 is transmitting 4G RF signals 16, such that the slot duration 54 is about 500 microseconds and the slot boundary duration 56 is about 25 microseconds.

Figure 7:
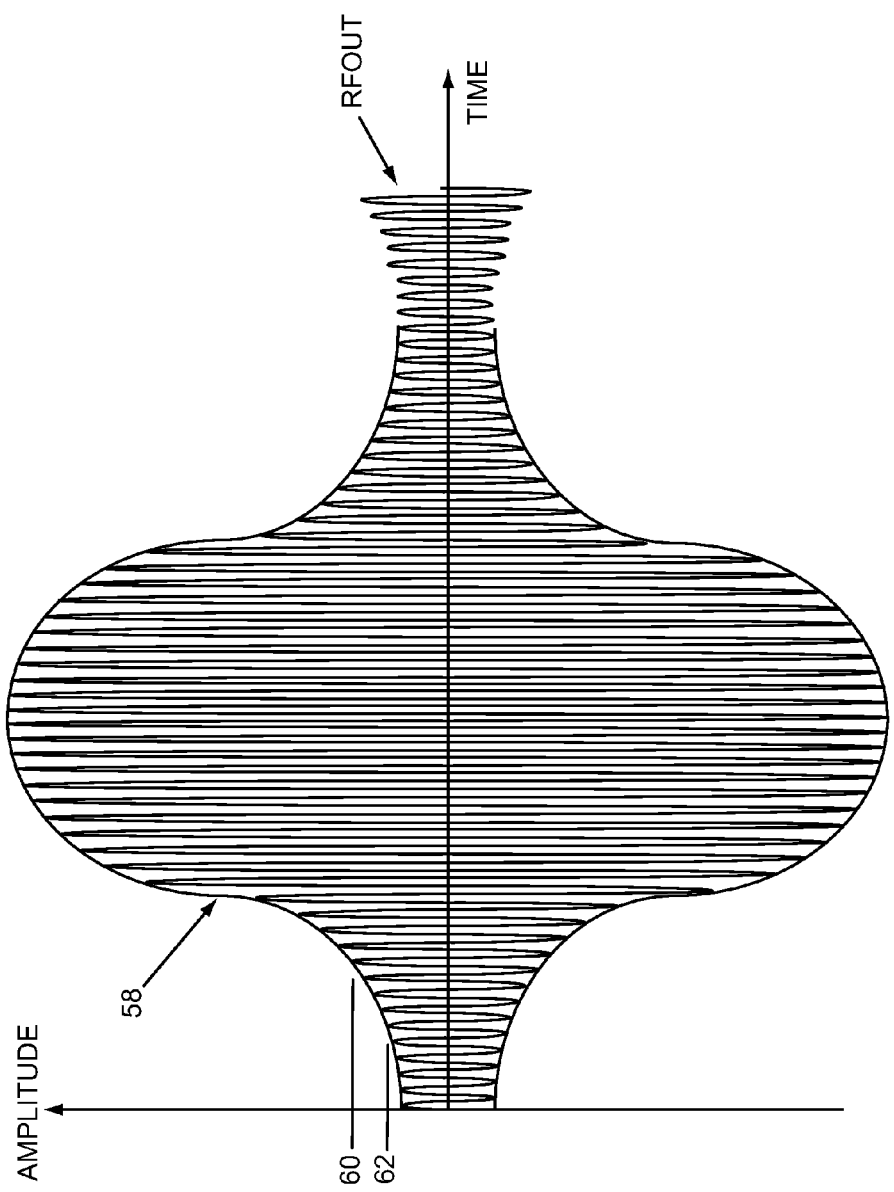
FIG. 7 shows details of the RF output signal illustrated in FIG. 2 according to an alternate embodiment of the first RF terminal.

FIG. 7 shows details of the RF output signal RFOUT illustrated in FIG. 2 according to an alternate embodiment of the first RF terminal 12. The RF output signal RFOUT may be amplitude modulated, phase modulated, frequency modulated, or any combination thereof. Typically, in many 3G and 4G communications protocols, the RF output signal RFOUT is both amplitude modulated and phase modulated. The RF output signal RFOUT illustrated in FIG. 7 includes AM and may or may not include phase modulation or frequency modulation. The AM of the RF output signal RFOUT has an RF envelope 58, which has a first threshold 60 and a second threshold 62. To minimize disruption of the RF output signal RFOUT, adjustments to the impedance of the tunable antenna matching circuit 30 or the tunable antenna matching circuit and delivered power detector 46, adjustments to the output power from the RF power amplifier 36, or both may be inhibited unless the RF envelope 58 is below the first threshold 60.

In embodiments of the first RF terminal 12 that detect both forward power and reverse power to determine delivered power, interfering transmitters near the first RF terminal 12 may cause errors in reverse power measurements. Such errors may cause errors in delivered power calculations. To reduce the effects of interfering transmitters, detected power from interfering transmitters may be detected and removed from normal reverse power measurements. When the RF envelope 58 is below the second threshold 62, reflections from the antenna 32 may be minimal, therefore, detected power from reverse power detection circuitry may be mainly indicative of power from interfering transmitters. The detected power from interfering transmitters may then be removed from normal reverse power detection measurements. Normal reverse power detection measurements may be made when the RF envelope 58 is above the second threshold 62. The detected power from interfering transmitters may be averaged over time using measurements taken from multiple cycles of the RF envelope 58. The second threshold 62 may be equal to, less than, or greater than the first threshold 60.

In general, power is detected from interfering transmitters using reverse power detection circuitry; the detecting power from interfering transmitters using reverse power detection circuitry is performed when the RF envelope 58 is below the second threshold 62 and detecting a change in the output power from the first RF terminal 12 is corrected using the detected power from the interfering transmitters.

Figure 8:
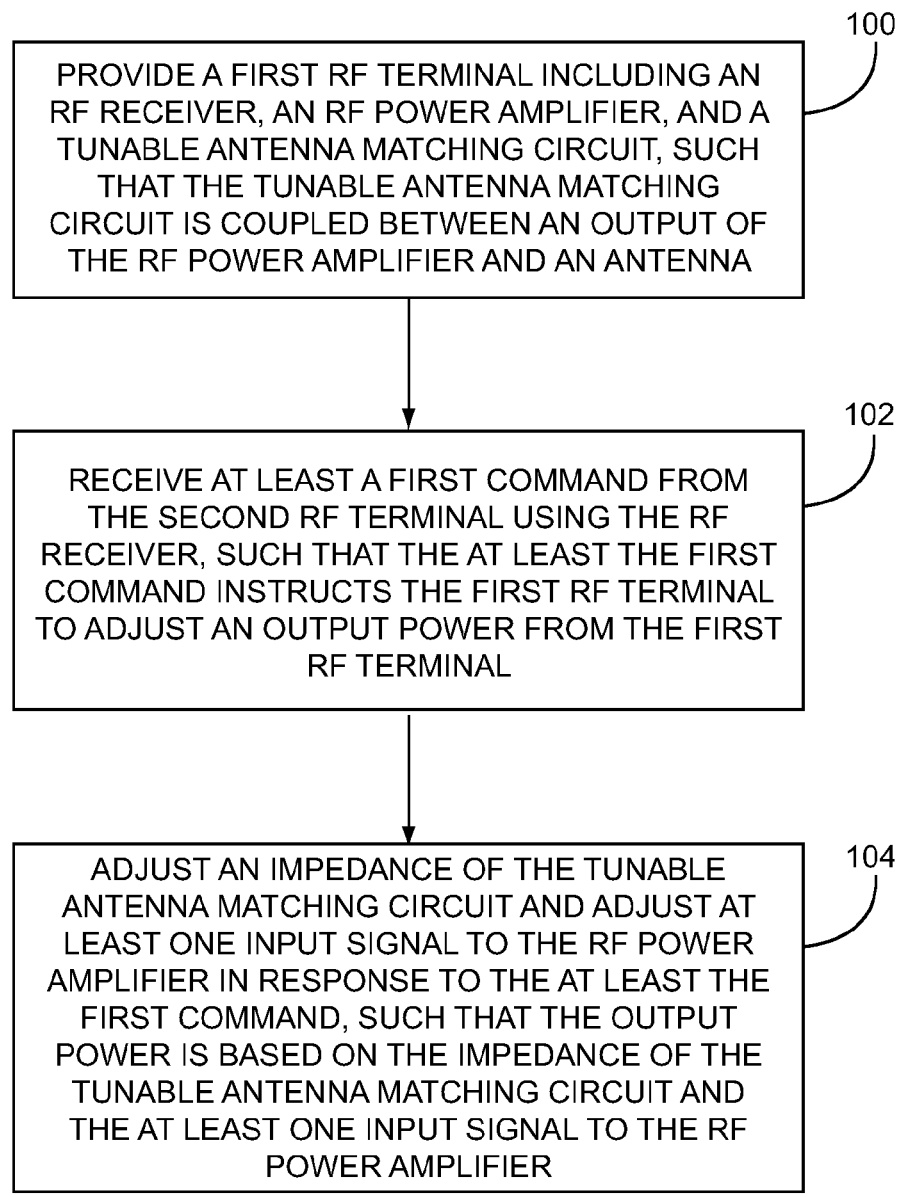
FIG. 8 shows a process associated with the RF communications system illustrated in FIG. 1 and the first RF terminal illustrated in FIG. 2 according to one embodiment of the RF communications system.

FIG. 8 illustrates a process associated with the RF communications system 10 illustrated in FIG. 1 and the first RF terminal 12 illustrated in FIG. 2 according to one embodiment of the RF communications system 10. The process begins by providing the first RF terminal 12, which includes the RF receiver 20, the RF power amplifier 36, and the tunable antenna matching circuit 30, such that the tunable antenna matching circuit 30 is coupled between an output of the RF power amplifier 36 and the antenna 32 (Step 100). The process continues by receiving at least a first command from the second RF terminal 14 using the RF receiver 20, such that the at least the first command instructs the first RF terminal 12 to adjust an output power from the first RF terminal 12 (Step 102). The process completes by adjusting an impedance of the tunable antenna matching circuit 30 and adjusting at least one input signal to the RF power amplifier 36 in response to the at least the first command, such that the output power is based on the impedance of the tunable antenna matching circuit 30 and the at least one input signal to the RF power amplifier 36 (Step 104).

Figure 9:
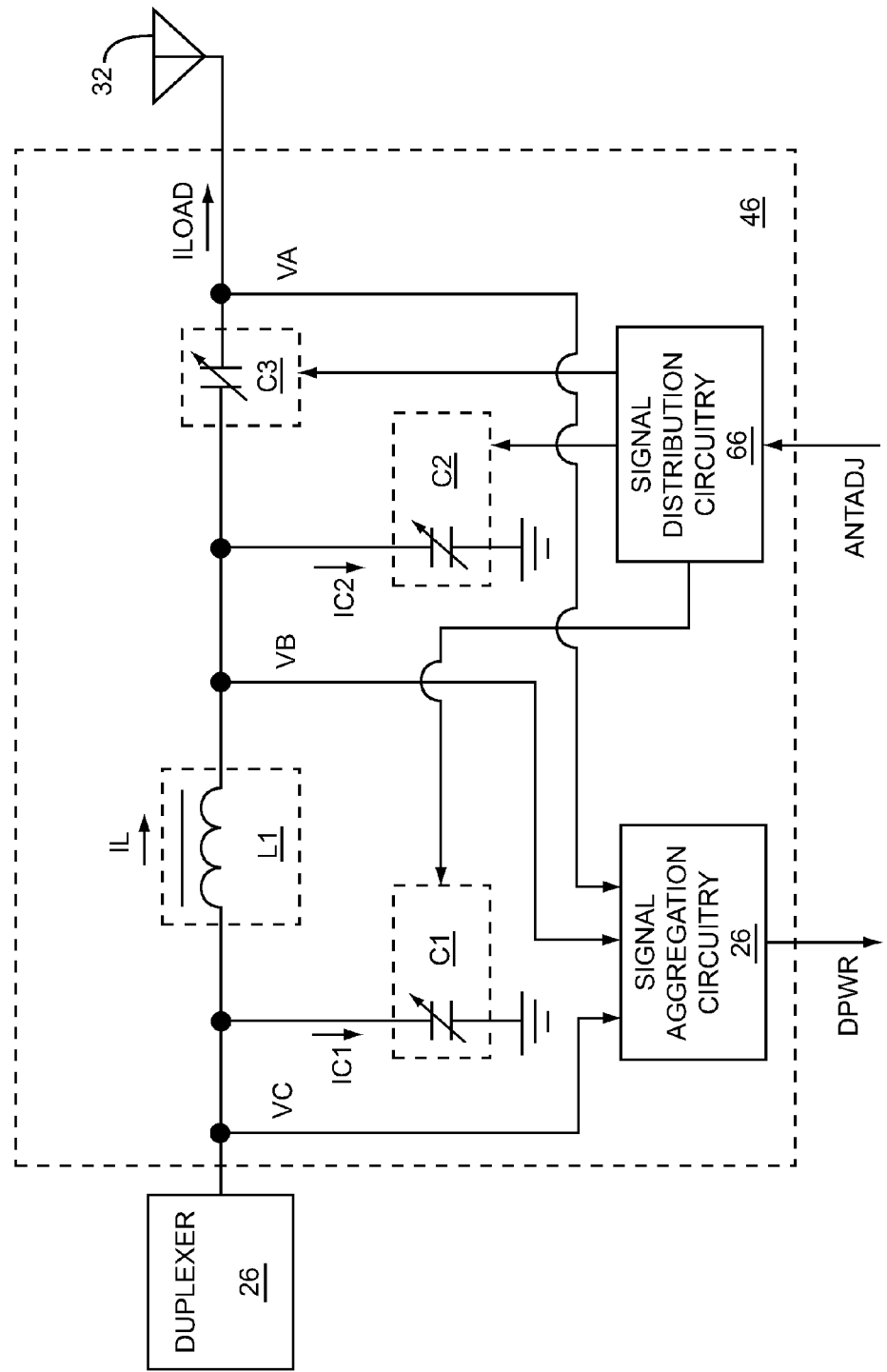
FIG. 9 shows details of a tunable antenna matching circuit and delivered power detector illustrated in FIG. 5 according to one embodiment of the tunable antenna matching circuit and delivered power detector.

FIG. 9 shows details of the tunable antenna matching circuit and delivered power detector 46 illustrated in FIG. 5 according to one embodiment of the tunable antenna matching circuit and delivered power detector 46. The tunable antenna matching circuit and delivered power detector 46 includes a first selectable capacitance circuit C1, a second selectable capacitance circuit C2, a third selectable capacitance circuit C3, a first inductive element L1, signal aggregation circuitry 64, and signal distribution circuitry 66. A first end of the first inductive element L1 is coupled to the duplexer 26 and a second end of the first inductive element L1 is coupled to the antenna 32 through the third selectable capacitance circuit C3. The first selectable capacitance circuit C1 is coupled between the first end of the first inductive element L1 and ground. The second selectable capacitance circuit C2 is coupled between the second end of the first inductive element L1 and ground.

The first selectable capacitance circuit C1, the second selectable capacitance circuit C2, and the first inductive element L1 form a PI network. The second end of the first inductive element L1 is coupled to a first end of the PI network; the first end of the first inductive element L1 is coupled to a second end of the PI network; the second selectable capacitance circuit C2 is coupled between the first end of the PI network and ground; the first selectable capacitance circuit C1 is coupled between the second end of the PI network and ground; the second end of the PI network is coupled to the output of the RF power amplifier 36 through the duplexer 26 or through the RF switch 40 (not shown); the first end of the PI network is coupled to a first end of the third selectable capacitance circuit C3; and a second end of the third selectable capacitance circuit C3 is coupled to the antenna 32. In general, the PI network and the third selectable capacitance circuit C3 are coupled in series between the output of the RF power amplifier 36 and the antenna 32.

The signal aggregation circuitry 64 is coupled to the second end of the third selectable capacitance circuit C3 to measure a first voltage VA at the second end of the third selectable capacitance circuit C3. The signal aggregation circuitry 64 is coupled to the second end of the first inductive element L1 to measure a second voltage VB at the second end of the first inductive element L1. The signal aggregation circuitry 64 is coupled to the first end of the first inductive element L1 to measure a third voltage VC at the first end of the first inductive element L1. The first voltage, the second voltage, and the third voltage VA, VB, VC are used by the signal aggregation circuitry 64 to provide the delivered power signal DPWR. The signal distribution circuitry 66 provides control signals to the first selectable capacitance circuit C1, to the second selectable capacitance circuit C2, and to the third selectable capacitance circuit C3 based on the antenna matching adjustment signal ANTADJ. The control signals select respective capacitances of the first selectable capacitance circuit C1, the second selectable capacitance circuit C2, and the third selectable capacitance circuit C3. The first inductive element L1 has an inductance current IL, the antenna 32 has a load current ILOAD, the first selectable capacitance circuit C1 has a first capacitance current IC1, and the second selectable capacitance circuit C2 has a second capacitance current IC2.

In general, according to one embodiment of the tunable antenna matching circuit and delivered power detector 46, the tunable antenna matching circuit and delivered power detector 46 illustrated in FIG. 9 detects delivered power to the antenna 32, and the adjustments made to the tunable antenna matching circuit and delivered power detector 46 and to the output power from the RF power amplifier 36 are based on the detected delivered power to the antenna 32.

Figure 10:
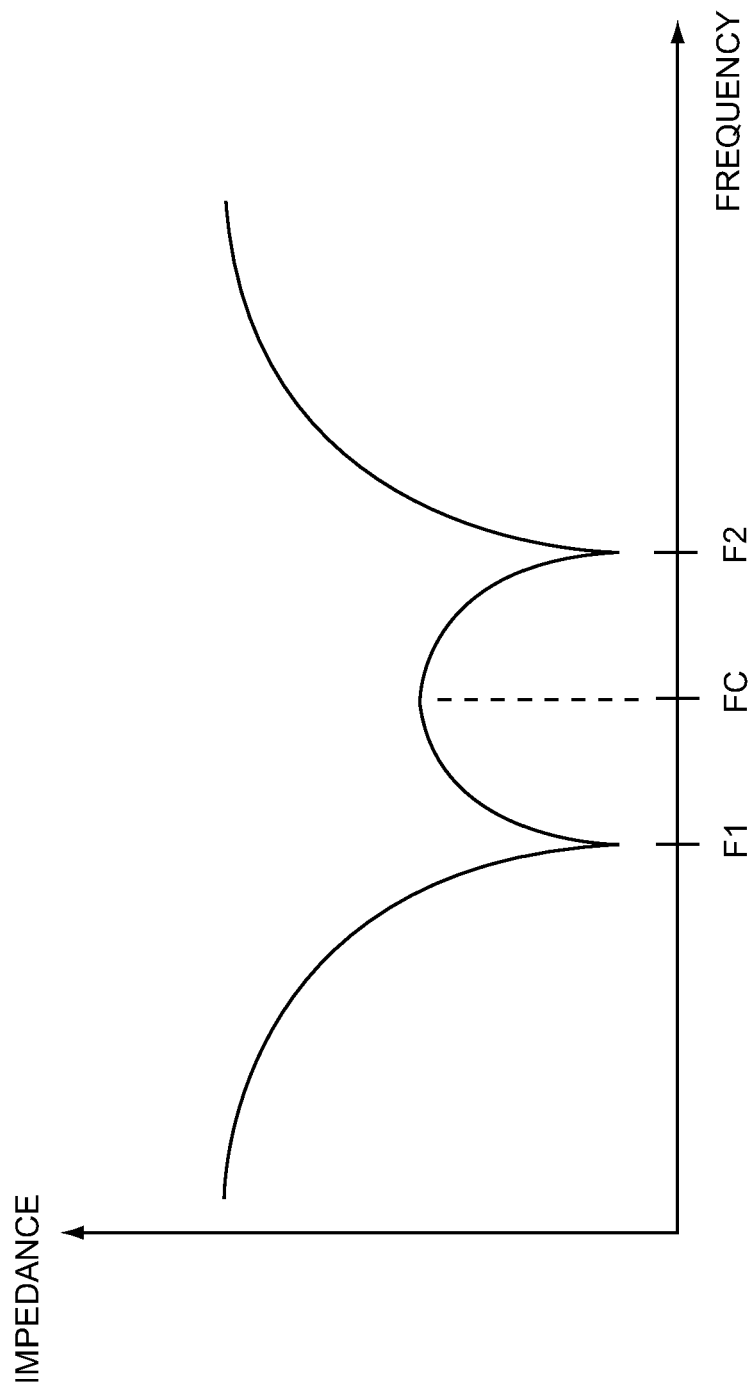
FIG. 10 is a graph showing an impedance response of the tunable antenna matching circuit and delivered power detector illustrated in FIG. 9 according to one embodiment of the tunable antenna matching circuit and delivered power detector.

Certain characteristics of the tunable antenna matching circuit and delivered power detector 46 illustrated in FIG. 9 may be beneficial in full duplex systems, which must be capable of transmitting and receiving simultaneously. As previously mentioned, simultaneous transmission and reception may require that a transmit frequency and a receive frequency be separated by a duplex frequency. As such, the tunable antenna matching circuit and delivered power detector 46 illustrated in FIG. 9 may rely on an inductive nature of the antenna 32, which is used in conjunction with the third selectable capacitance circuit C3 to tune a center frequency of an impedance response of the tunable antenna matching circuit and delivered power detector 46. The impedance response includes two separate impedance valleys that may be tuned to correlate with a transmit frequency and a receive frequency. Therefore, the first selectable capacitance circuit C1 and the second selectable capacitance circuit C2 may be used to tune the impedance valleys relative to the center frequency of the impedance response, and the third selectable capacitance circuit C3 may be used to tune the center frequency. Since no desired signals are transmitted or received at the center frequency, a particular impedance response at the center frequency may not be required or relevant. In this regard, FIG. 10 illustrates this behavior. In general, the impedance response of the tunable antenna matching circuit and delivered power detector 46 has a passband response and a passband center frequency of the passband response is based on a selected capacitance of the third selectable capacitance circuit C3.

FIG. 10 is a graph showing an impedance response of the tunable antenna matching circuit and delivered power detector 46 illustrated in FIG. 9 according to one embodiment of the tunable antenna matching circuit and delivered power detector 46. The impedance response shows a relatively low impedance at a first frequency F1, a relatively low impedance at a second frequency F2, and a relatively high impedance at a center frequency FC and a relatively high impedance at frequencies above the second frequency F2 and below the first frequency F1. At the first and second frequencies F1, F2, the tunable antenna matching circuit and delivered power detector 46 may provide an approximate impedance match to the antenna 32 and at other frequencies, the tunable antenna matching circuit and delivered power detector 46 may provide an impedance mismatch to the antenna 32. In a first embodiment of the tunable antenna matching circuit and delivered power detector 46, the first frequency F1 is about equal to a transmit frequency from the first RF terminal 12 and the second frequency F2 is about equal a desired receive frequency of the first RF terminal 12. In a second embodiment of the tunable antenna matching circuit and delivered power detector 46, second frequency F2 is about equal to a transmit frequency from the first RF terminal 12 and the first frequency F1 is about equal a desired receive frequency of the first RF terminal 12. Since the first RF terminal 12 is not transmitting or receiving signals at the center frequency FC, the impedance response of the tunable antenna matching circuit and delivered power detector 46 at the center frequency FC may not be particularly relevant; however, the shape of the impedance response illustrated in FIG. 10 may have certain benefits, which will be presented with FIGS. 11A, 11B, and 110.

Another beneficial characteristic of the tunable antenna matching circuit and delivered power detector 46 illustrated in FIG. 9 is that by using the first, the second, and the third voltages VA, VB, VC, the tunable antenna matching circuit and delivered power detector 46 illustrated in FIG. 9 may detect delivered power to the antenna 32 without a dependency on an RF frequency of the RF output signal RFOUT. An analysis of the tunable antenna matching circuit and delivered power detector 46 illustrated in FIG. 9 is presented that illustrates detected power without the dependency on an RF frequency of the RF output signal RFOUT. Calculations regarding the delivered power are shown below. Vector mathematics is used to represent the first, the second, and the third voltages VA, VB, VC. In the equations below, VA is used to represent the first voltage VA, VB is used to represent the second voltage VB, VC is used to represent the third voltage VC, C3 is used to represent the capacitance of the third selectable capacitance circuit C3, L1 is used to represent the inductance of the first inductive element L1, IL is used to represent the inductance current IL, ILOAD is used to represent the load current ILOAD, IC1 is used to represent the first capacitance current IC1, and IC2 is used to represent the second capacitance current IC2.

As a reminder of vector mathematics, the conjugate of two multiplied vectors is show below in EQ. 1.

$$\begin{aligned} Conj(V1 \cdot V2) &= conj(v1 \cdot \exp(j \cdot ph1) \cdot v2 \cdot \exp(j \cdot ph2)), \\ &= conj(v1 \cdot v2 \cdot \exp(j \cdot (phi1 + phi2))), \\ &= v1 \cdot v2 \cdot \exp(-j \cdot (phi1 + phi2)), \\ &= v1 \cdot \exp(-j \cdot phi1) \cdot v2 \cdot \exp(-j \cdot phi2), \\ &= conj(V1) \cdot conj(V2), \end{aligned}$$ EQ. 1 where V1=v1·exp(j·ph1), v1 is the amplitude of the vector and ph1 is the phase of the vector.

Applying the principles of Kirchhoff's current law to the tunable antenna matching circuit and delivered power detector 46 illustrated in FIG. 9 provides EQ. 2 below.

$$ILOAD = IL - IC2.$$ EQ. 2

The delivered power Pdel to the antenna 32 is given by EQ. 3 below.

$$Pdel = \tfrac{1}{2} * Re(VA \cdot conj(ILOAD)),$$ EQ. 3 where conj is the conjugate of the vector ILOAD.

ILOAD may be represented in terms of the voltage drop across the third selectable capacitance circuit C3 as shown in EQ. 4 below.

$$ILOAD = (j \cdot C3 \cdot \omega) \cdot (VB - VA).$$ EQ. 4

Substituting EQ. 4 into EQ. 3 provides EQ. 5 below.

$$Pdel = \tfrac{1}{2} \cdot Re(VA \cdot conj(j \cdot C3 \cdot \omega \cdot (VB - VA))).$$ EQ. 5

Applying the relationship established in EQ. 1 to EQ. 5 provides EQ. 6 below.

$$Pdel = \tfrac{1}{2} Re(VA \cdot conj(j \cdot C3 \cdot \omega \cdot VB)) - \tfrac{1}{2} Re(VA \cdot conj \\ (j \cdot C3 \cdot \omega \cdot VA)).$$ EQ. 6

Since conj(j)=−j, the term −½Re(VA·conj(j·C3·ω·VA)) in EQ. 6 is equal to −½Re(C3·ω·VA·conj(VA)·conj(j)), which is equal to ½Re(C3·ω·va^2·j). Since (C3·ω·va^2·j) has only an imaginary part and no real part, ½Re(C3·ω·va^2·j) is equal to zero. Therefore, EQ. 6 reduces to EQ. 7 below.

$$Pdel = \tfrac{1}{2} Re(VA \cdot conj(j \cdot C3 \cdot \omega \cdot VB)).$$ EQ. 7

EQ. 7 is re-arranged to provide EQ. 8 below.

$$Pdel = -\tfrac{1}{2} \cdot C3 \cdot \omega \cdot Re(VA \cdot conj(j \cdot VB)).$$ EQ. 8

However, EQ. 8 includes the w term, which makes Pdel dependent on frequency. By similarly calculating the voltage drop across the first inductive element L1 in terms of the inductance current IL, Pdel may be calculated as shown in EQ. 9 below.

$$Pdel = \tfrac{1}{2} \cdot 1/(L1 \cdot \omega) \cdot Re(VB \cdot conj(j \cdot VC)).$$ EQ. 9

Multiplying EQ. 8 by EQ. 9 provides EQ. 10 below.

$$Pdel^2 = -\tfrac{1}{2} \cdot C3 \cdot \omega \cdot Re(VA \cdot conj(j \cdot VB)) \cdot \tfrac{1}{2} \cdot 1/(L1 \cdot \omega) \cdot Re \\ (VB \cdot conj(j \cdot VC)).$$ EQ. 10

EQ. 10 reduces to EQ. 11 below.

$$Pdel^2 = -\tfrac{1}{4}(C3/L1)(Re(VA \cdot conj(j \cdot VB)) \cdot Re(VB \cdot conj \\ (j \cdot VC))).$$ EQ. 11

Therefore, EQ. 11 illustrates how delivered power to the antenna 32 may be obtained without a dependency on the RF frequency of the RF output signal RFOUT.

There are theoretical limitations on impedance matching networks that may be used in optimizing certain designs. In reference to a book entitled "Microwave Filters, Impedance-Matching Networks, and coupling structures" from G. Matthaei 1980, in section 1.03, there is a theoretical limitation, which exists on broadband impedance matching. If a load to be matched consisting of a capacitor C1 and a resistor R0 in parallel, and a lossless impedance matching network is inserted between a generator and a load, an input reflection coefficient γ response follows a limitation provided by Bode and Fano over an operating frequency. The best possible results are limited as indicated by EQ. 12 below.

$$\int_0^\infty \ln\left|\frac{1}{\gamma}\right| d\omega = \pi/(R0.C1).$$ EQ. 12

Assuming a good desired match over a frequency range from wa to wb with no good matching (i.e. γ=1) outside this range, EQ. 12 can be re-expressed by using the Q quality definition of the load as shown in EQ. 13 below.

$$\int_{wa}^{wb} \ln\left|\frac{1}{\gamma}\right| d\omega = \pi w0/(R0.C1.w0) = \pi w0/Q = \pi.\Delta w.$$ EQ. 13

From EQ. 13, as Q of the load increases, a −3 dB bandwidth (Δw) decreases, which lowers the integral term. Further, EQ. 13 indicates that an ideal impedance matching of the load would be a bandpass filter that cuts-off sharply at the edge of the bands to minimize the integral portion outside of the band and to allow the lowest γ (i.e. the highest ln|1/γ|) over the band of interest but still limited by EQ. 12. Higher Q loads provide lower integral limitations, thus providing constraints.

FIGS. 11A, 11B, and 11C illustrate the tradeoffs. FIG. 11A is a graph showing a refection coefficient bandpass filter response over frequency. A passband is between the first frequency F1 and the second frequency F2. The value of the reflection coefficient inside the passband is limited by the constraints imposed by EQ. 13. The constraints may be such that an area of the passband below a maximum reflection coefficient may be about constant. The area is shown as a cross-hatched region in FIG. 11A. FIG. 11B is a graph showing a refection coefficient bandpass filter response over frequency, such that the passband is narrower than the passband illustrated in FIG. 11A. However, the area of the passband below the maximum reflection coefficient, shown as a cross-hatched region, is the same as the area illustrated in FIG. 11A due to the constraints of EQ. 13, but since the passband is narrower, the minimum value of the reflection coefficient is lower. FIG. 11C is a graph showing a refection coefficient bandpass filter response over frequency of the tunable antenna matching circuit and delivered power detector 46 illustrated in FIG. 9, such that the passband is the same as the passband illustrated in FIG. 11B. The area of the passband below the maximum reflection coefficient, shown as a cross-hatched region, is the same as the area illustrated in FIG. 11B due to the constraints of EQ. 13. However, since the reflection coefficient is higher at the center frequency FC than at the first and second frequencies F1, F2, the minimum values of the first and second frequencies F1, F2 permitted by EQ. 13 in FIG. 11C are lower than the minimum values of the first and second frequencies F1, F2 permitted by EQ. 13 in FIG. 11B. Since the first RF terminal 12 may transmit and receive at the first and second frequencies F1, F2, having lower reflection coefficients at those frequencies may provide better matching characteristics.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
providing a first radio frequency (RF) terminal comprising an RF receiver, an RF power amplifier, and a tunable antenna matching circuit, such that the tunable antenna matching circuit is coupled between an output of the RF power amplifier and an antenna;
receiving at least a first command from a second RF terminal using the RF receiver, such that the at least the first command instructs the first RF terminal to adjust an output power from the first RF terminal;
adjusting an impedance of the tunable antenna matching circuit and adjusting at least one input signal to the RF power amplifier in response to the at least the first command;
detecting a phase shift of an RF transmit signal from the first RF terminal resulting from adjusting impedance of the tunable antenna matching circuit; and
applying a compensating phase shift to an input signal to the RF power amplifier based on the detected phase shift,
wherein the output power is based on the impedance of the tunable antenna matching circuit and the at least one input signal to the RF power amplifier.

2. The method of claim 1 wherein the at least the first command is part of an output power control loop between the first RF terminal and the second RF terminal.

3. The method of claim 1 wherein the second RF terminal is a base station and the first RF terminal is a mobile terminal.

4. The method of claim 1 wherein the first command is a transmit power control (TPC) command.

5. The method of claim 1 further comprising detecting a change in the output power from the first RF terminal resulting from the adjusting the impedance of the tunable antenna matching circuit, such that:
the adjusting the at least one input signal to the RF power amplifier follows the adjusting the impedance of the tunable antenna matching circuit and the detecting the change in the output power from the first RF terminal resulting from the adjusting the impedance of the tunable antenna matching circuit;
power adjustment information specified in the first command is modified using the detected change in the output power to provide modified power adjustment information; and
the adjusting the at least one input signal to the RF power amplifier is based on the modified power adjustment information.

6. The method of claim 5 further comprising detecting power from interfering transmitters using reverse power detection circuitry, such that:
the output power from the first RF terminal is provided by an RF output signal from the RF power amplifier;
the RF output signal comprises amplitude modulation (AM) having an RF envelope;
the detecting power from interfering transmitters using reverse power detection circuitry is performed when the RF envelope is below a first threshold; and
the detecting the change in the output power from the first RF terminal is corrected using the detected power from interfering transmitters.

7. The method of claim 6 wherein the detected power from interfering transmitters is averaged over time using measurements taken from multiple cycles of the RF envelope.

8. The method of claim 1 wherein the adjusting the impedance of the tunable antenna matching circuit and the adjusting the at least one input signal to the RF power amplifier are during a slot boundary.

9. The method of claim 8 wherein the slot boundary follows a first slot and a second slot follows the slot boundary, such that the first slot and the second slot each have a slot duration equal to about 500 microseconds.

10. The method of claim 8 wherein the slot boundary follows a first slot and a second slot follows the slot boundary, such that the first slot and the second slot each have a slot duration equal to about 667 microseconds.

11. The method of claim 8 wherein:
the output power from the first RF terminal is provided by an RF output signal from the RF power amplifier;
the RF output signal comprises amplitude modulation (AM) having an RF envelope; and the adjusting the impedance of the tunable antenna matching circuit and the adjusting the at least one input signal to the RF power amplifier are performed when the RF envelope is below a first threshold.

12. The method of claim 1 wherein:
the output power from the first RF terminal is provided by an RF output signal from the RF power amplifier;
the RF output signal comprises amplitude modulation (AM) having an RF envelope; and
the adjusting the impedance of the tunable antenna matching circuit and the adjusting the at least one input signal to the RF power amplifier are performed when the RF envelope is below a first threshold.

13. The method of claim 1 further comprising continuously transmitting information using multiple communications slots, which are separated by slot boundaries in time, such that the adjusting the impedance of the tunable antenna matching circuit and the adjusting the at least one input signal to the RF power amplifier are made during each slot boundary.

14. The method of claim 1 wherein the at least one input signal to the RF power amplifier comprises an RF input signal, such that the RF power amplifier amplifies the RF input signal to provide an RF output signal.

15. The method of claim 14 wherein the at least one input signal to the RF power amplifier further comprises an envelope power supply signal.

16. The method of claim 1 wherein the at least one input signal to the RF power amplifier comprises an envelope power supply signal.

17. The method of claim 1 further comprising detecting delivered power to the antenna using the tunable antenna matching circuit, such that the adjustment to the tunable antenna matching circuit and the adjustment to the at least one input signal to the RF power amplifier are based on the detected delivered power to the antenna.

18. The method of claim 17 wherein the tunable antenna matching circuit comprises a PI network and a first selectable capacitance circuit coupled in series between the output of the RF power amplifier and the antenna.

19. The method of claim 18 wherein:
a first end of the PI network is coupled to a first end of the first selectable capacitance circuit;
a second end of the first selectable capacitance circuit is coupled to the antenna;
the output power from the first RF terminal is provided by an RF output signal from the RF power amplifier, such that the RF output signal has an RF frequency;
the detected delivered power is based on a first voltage at the second end of the first selectable capacitance circuit, on a second voltage at the first end of the first selectable capacitance circuit, and on a third voltage at a second end of the PI network; and
the detected delivered power is not based on the RF frequency.

20. The method of claim 18 wherein a passband center frequency of the tunable antenna matching network is selected by selecting a capacitance of the first selectable capacitance circuit.

21. The method of claim 18 wherein:
a first end of the PI network is coupled to a first end of the first selectable capacitance circuit;
a second end of the first selectable capacitance circuit is coupled to the antenna; and
the PI network comprises:
a second tunable capacitance network coupled between the first end of the PI network and ground;
a third tunable capacitance network coupled between a second end of the PI network and ground; and
a first inductive element coupled between the first end of the PI network and the second end of the PI network.

22. A first radio frequency (RF) terminal comprising:
an RF receiver adapted to receive at least a first command from a second RF terminal, such that the at least the first command instructs the first RF terminal to adjust an output power from the first RF terminal;
an RF power amplifier adapted to receive at least one input signal;
an antenna;
a tunable antenna matching circuit coupled between an output of the RF power amplifier and the antenna; and
control circuitry adapted to:
adjust an impedance of the tunable antenna matching circuit and adjust the at least one input signal to the RF power amplifier in response to the at least the first command;
detect a phase shift of an RF transmit signal from the first RF terminal resulting from adjusting impedance of the tunable antenna matching circuit; and
apply a compensating phase shift to an input signal to the RF power amplifier based on the detected phase shift,
wherein the output power is based on the impedance of the tunable antenna matching circuit and the at least one input signal to the RF power amplifier.

* * * * *